United States Patent
Ying et al.

(10) Patent No.: US 6,759,263 B2
(45) Date of Patent: Jul. 6, 2004

(54) METHOD OF PATTERNING A LAYER OF MAGNETIC MATERIAL

(76) Inventors: Chentsau Ying, 10370 N. Blaney Ave., Cupertino, CA (US) 95014; Xiaoyi Chen, 811 Volans La., Foster City, CA (US) 94404; Padmapani C. Nallan, 2200 Pettigrew Dr., San Jose, CA (US) 95148; Ajay Kumar, 510 Kenilworth Ct., Sunnyvale, CA (US) 94087

(*) Notice: Subject to any disclaimer, the term of this patent is extended or adjusted under 35 U.S.C. 154(b) by 44 days.

(21) Appl. No.: 10/231,620

(22) Filed: Aug. 29, 2002

(65) Prior Publication Data

US 2004/0043526 A1 Mar. 4, 2004

(51) Int. Cl.⁷ ............................................... H01L 21/00
(52) U.S. Cl. ......................... 438/48; 438/551; 438/911
(58) Field of Search ............................ 438/3, 48, 207, 438/264, 294, 498, 551, 911

(56) References Cited

U.S. PATENT DOCUMENTS

| | | | |
|---|---|---|---|
| 5,496,759 A | 3/1996 | Yue et al. ........................ 437/52 |
| 5,607,599 A | 3/1997 | Ichihara et al. ................ 216/22 |
| 5,732,016 A | 3/1998 | Chen et al. ..................... 365/158 |
| 5,920,500 A | 7/1999 | Tehrani et al. ................. 365/173 |
| 5,940,319 A | 8/1999 | Durlam et al. ................. 365/171 |
| 6,024,885 A | 2/2000 | Pendharkar et al. ............ 216/22 |
| 6,048,739 A | 4/2000 | Hurst et al. ..................... 438/3 |
| 6,153,443 A | 11/2000 | Durlam et al. .................. 438/3 |
| 6,165,803 A | 12/2000 | Chen et al. ...................... 438/3 |
| 6,174,737 B1 | 1/2001 | Durlam et al. .................. 438/3 |
| 6,219,274 B1 * | 4/2001 | Shimazawa et al. .......... 365/158 |
| 6,365,419 B1 | 4/2002 | Durlam et al. .................. 438/3 |

* cited by examiner

Primary Examiner—Phuc T. Dang
(74) Attorney, Agent, or Firm—Joseph Bach; Moser Patterson & Sheridan LLP

(57) ABSTRACT

A method of patterning a layer of magnetic material to form isolated magnetic regions. The method forms a mask on a film stack comprising a layer of magnetic material such the protected and unprotected regions are defined. The unprotected regions are oxidized to form isolated magnetic regions.

24 Claims, 12 Drawing Sheets

METHOD OF PATTERNING A LAYER OF MAGNETIC MATERIAL

BACKGROUND OF THE INVENTION

1. Field of the Invention

The present invention generally relates to a method for fabrication devices on semiconductor substrates. More specifically, the invention relates to a method of patterning a layer of magnetic material for fabrication of a magneto-resistive random access memory (MRAM) device.

2. Description of the Related Art

Magneto-resistive random access memory (MRAM) has been developed as a new type of non-volatile memory. Digital information in MRAM is represented by the direction of magnetization of a magnetic material. MRAM has a plurality of memory cells that are interconnected to one another to facilitate storage of information within the MRAM. A memory cell in an MRAM device generally is a multi-layered structure comprising a pair of magnetic layers separated by a tunnel layer. These layers are deposited as overlying blanket films, layer-by-layer, and then featured to form a MRAM device. More specifically, the MRAM device comprises a free (or top) magnetic layer that may change a direction of magnetization and a bottom magnetic layer that has a fixed direction of magnetization. The magnetic layers are separated by a thin tunnel layer formed of a non-magnetic dielectric material such as aluminum oxide ($Al_2O_3$) and the like. The top and bottom magnetic layers may each comprise a plurality of layers of magnetic materials such as permalloy (NiFe), cobalt iron (CoFe), and the like. The top and bottom magnetic layers are also supplied with film electrodes (e.g., comprising conductors such as tantalum (Ta), tantalum nitride (TiN), copper (Cu), and the like) to form an electrical connection for the memory cell to the lines of the MRAM.

Fabrication of a MRAM device comprises etch processes in which one or more layers that comprise a film stack are removed, either partially or in total. The MRAM device comprises the layers that are generally formed from materials that may be easily oxidized, sensitive to corrosion or very thin and as such are difficult to etch with no damage to the stack. In the prior art, during etching a MRAM film stack, the etchants may erode the layers of the stack or leave metal-containing residues. These problems arise from low etch selectivity and non-volatile nature of by-products that are formed during an etch process. Such residues may build up along the sides of the film stack and form a conductive veil-like pattern. The conductive residues or eroded layers may cause electrical short-circuits within a MRAM device, e.g., between the magnetic layers separated by the tunnel layer, or may render the MRAM device to operate sub-optimally or not at all.

Therefore, there is a need in the art for a method of patterning magnetic materials for fabrication a magneto-resistive random access memory (MRAM) device.

SUMMARY OF THE INVENTION

The present invention is a method of patterning a layer of magnetic material by forming a mask on a film stack that comprises the layer. The mask defines the layer into protected and unprotected regions. The layer is then oxidized to form isolated magnetic regions located at the protected regions.

In one embodiment, the method is used for fabrication of a magneto-resistive random access memory (MRAM) device comprising a MRAM film stack that is formed on a semiconductor substrate. The stack comprises a top electrode layer (e.g., Ta, TaN, and the like), a free magnetic layer (e.g., NiFe, CoFe, and the like), a tunnel layer (e.g., $Al_2O_3$ and the like), a magnetic film stack comprising layers of NiFe, Ru, CoFe, PtMn, NiFe, NiFeCr, and the like, a bottom electrode layer (e.g., Ta, TaN, and the like), and a barrier layer (e.g., $SiO_2$ and the like).

The method is a sequence of processes comprising forming a first sacrificial hard mask, plasma etching the top electrode using a chlorine chemistry, performing a first residue removal, oxidizing the free magnetic layer using an oxygen based plasma chemistry, forming a second sacrificial hard mask, plasma etching the magnetic film stack, plasma etching the bottom electrode layer, and performing a second residue removal.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is a method of patterning a layer of magnetic material. In one embodiment, the invention is used to fabricate a magneto-resistive random access memory (MRAM) device comprising a MRAM film stack that is formed on a semiconductor substrate (also referred to herein as a wafer). The MRAM film stack comprises a top electrode (e.g., tantalum (Ta), tantalum nitride (TaN), and the like), a free magnetic layer (e.g., NiFe, CoFe, and the like), a tunnel layer (e.g., $Al_2O_3$ and the like), a multi-layer magnetic stack comprising layers of NiFe, ruthenium (Ru), CoFe, PtMn, NiFe, NiFeCr and the like, a bottom electrode layer (e.g., Ta, TaN, and the like), and a barrier layer (e.g., $SiO_2$ and the like).

Figure 1A:
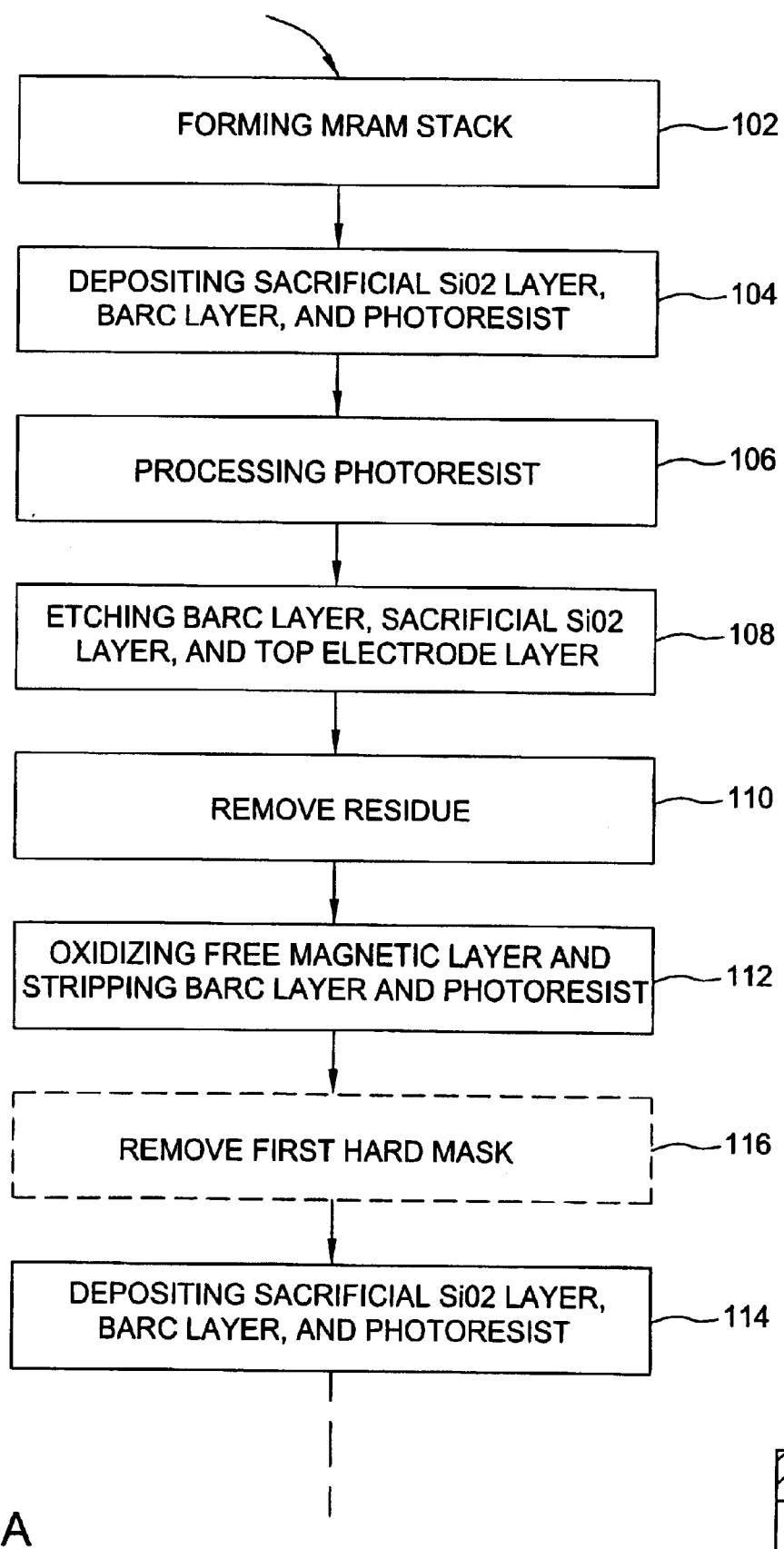
FIGS. 1A and 1B together depict a flow diagram of an example of the present invention.
Figure 1B:
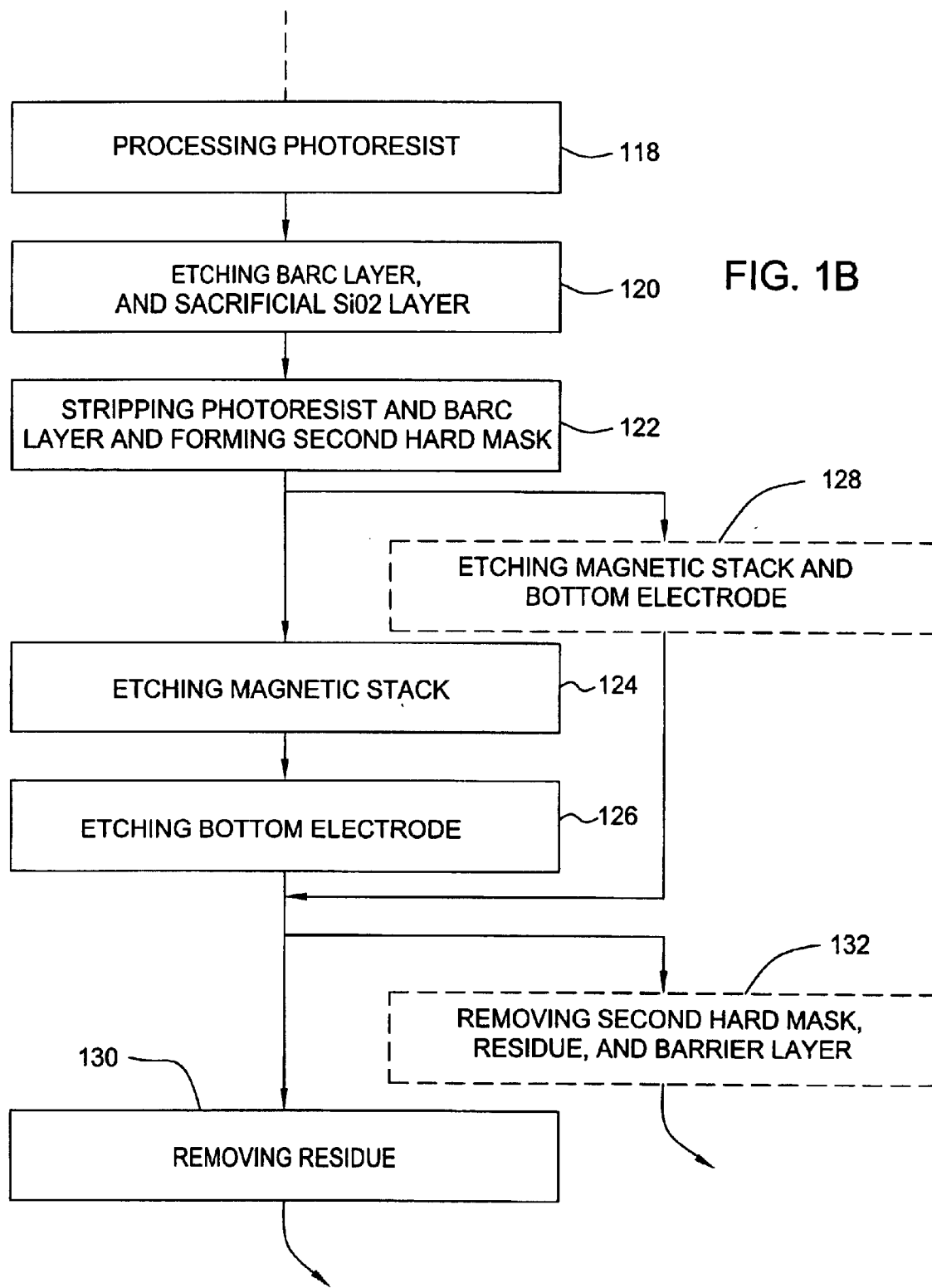

FIGS. 1A and 1B together depict a flow diagram of one embodiment of the inventive method as a sequence 100. The sequence 100 comprises the processes that are performed upon a MRAM film stack during fabrication of the MRAM device.

Figure 2A:
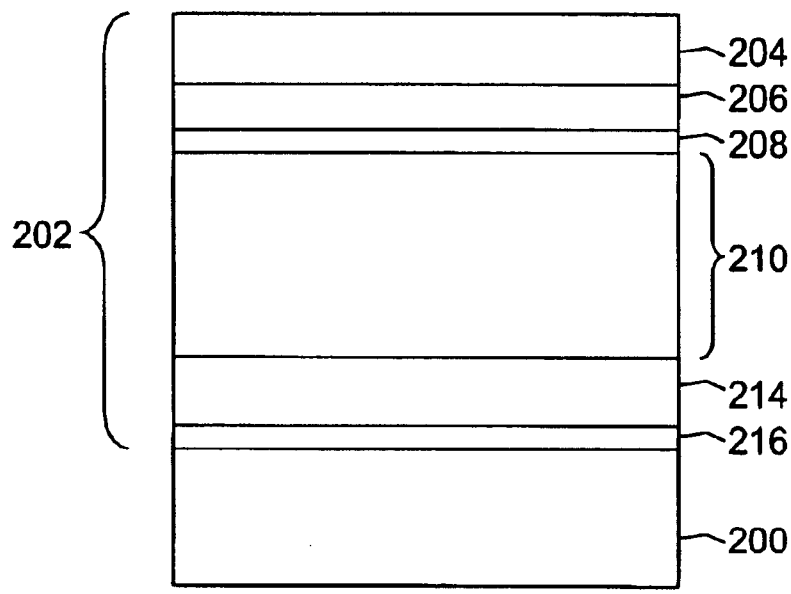
FIGS. 2A–2N depict a sequence of schematic, cross-sectional views of a substrate having a MRAM film stack being formed in accordance with an example of the present invention.
Figure 2B:
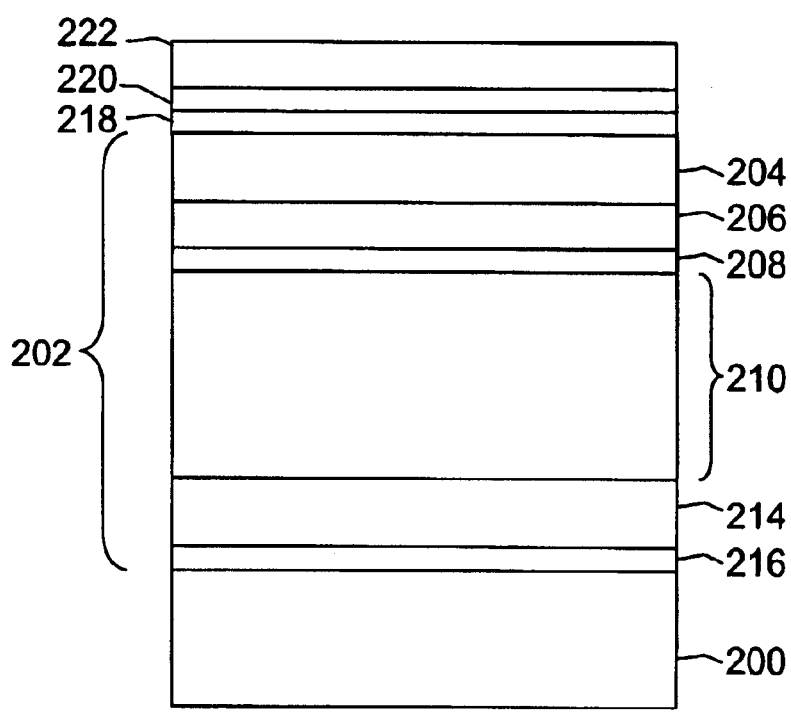
Figure 2C:
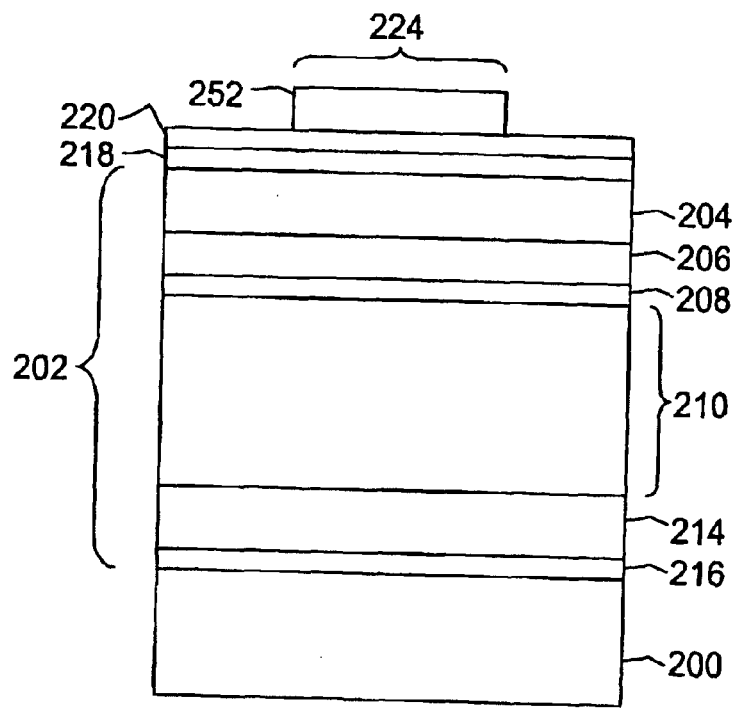
Figure 2D:
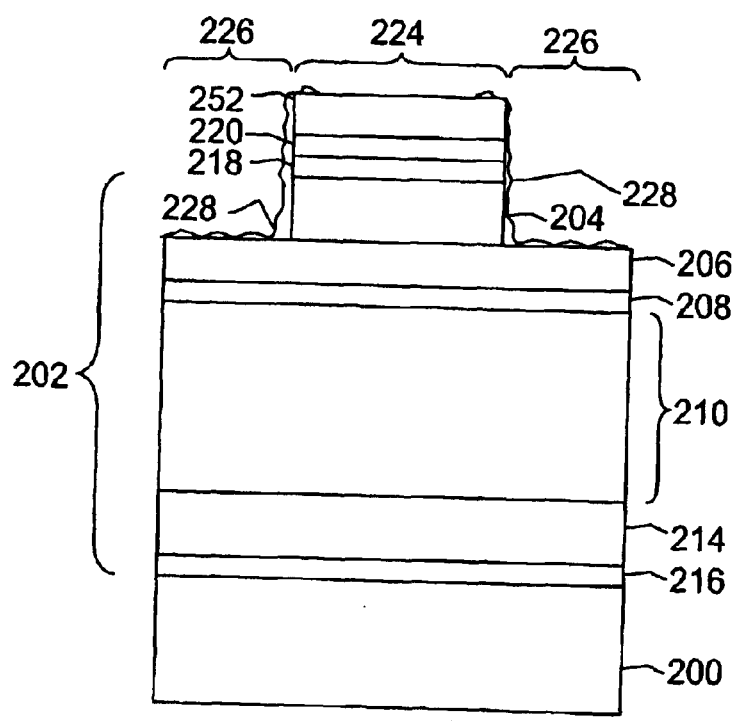
Figure 2E:
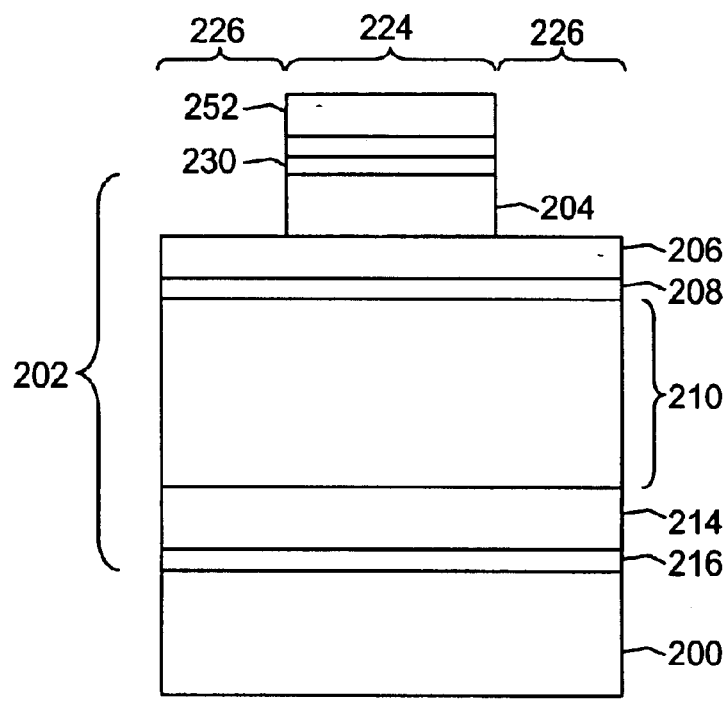
Figure 2F:
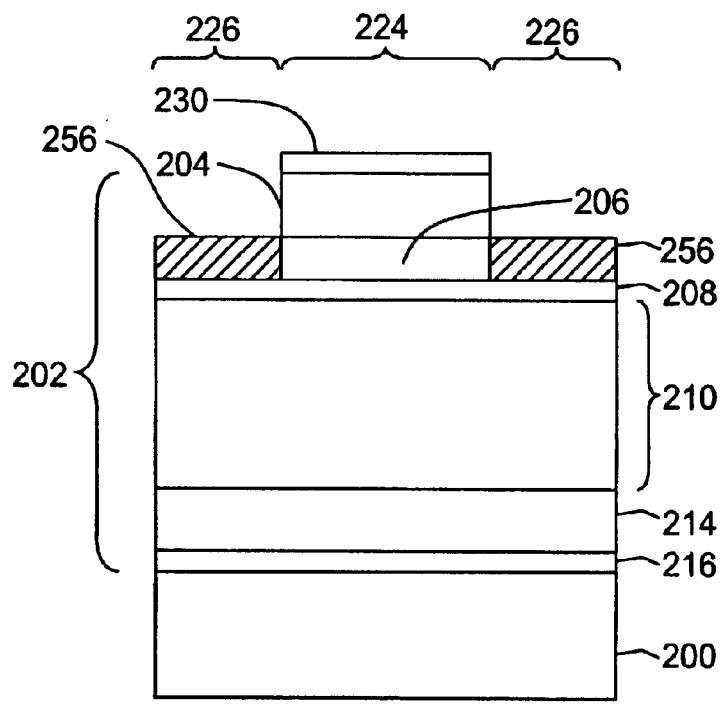
Figure 2G:
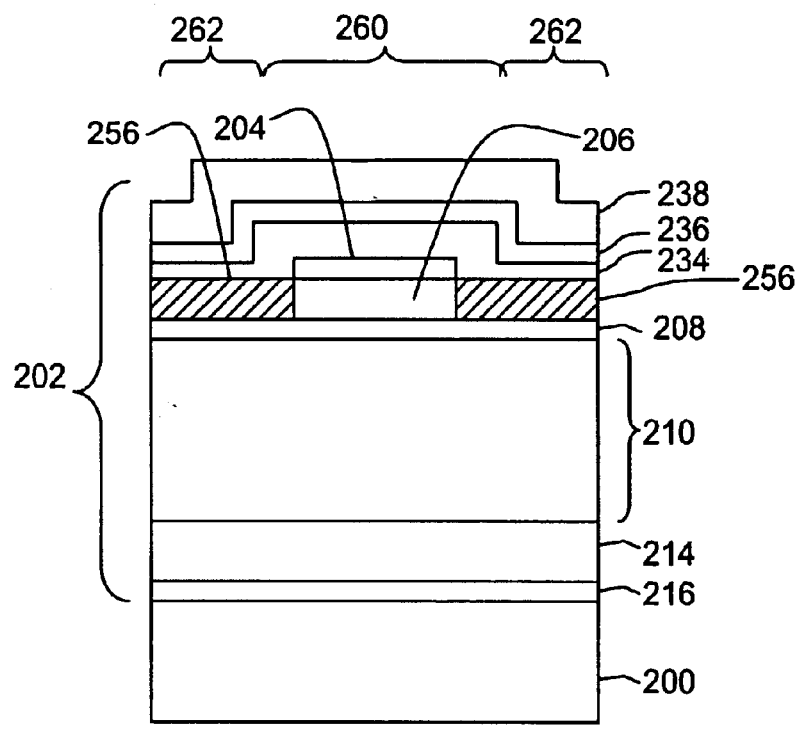
Figure 2H:
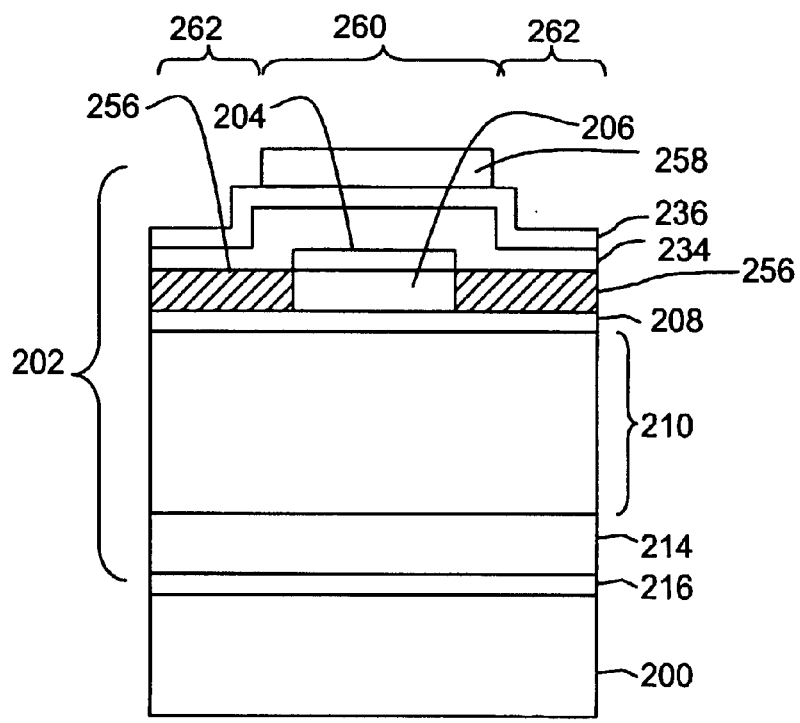
Figure 2I:
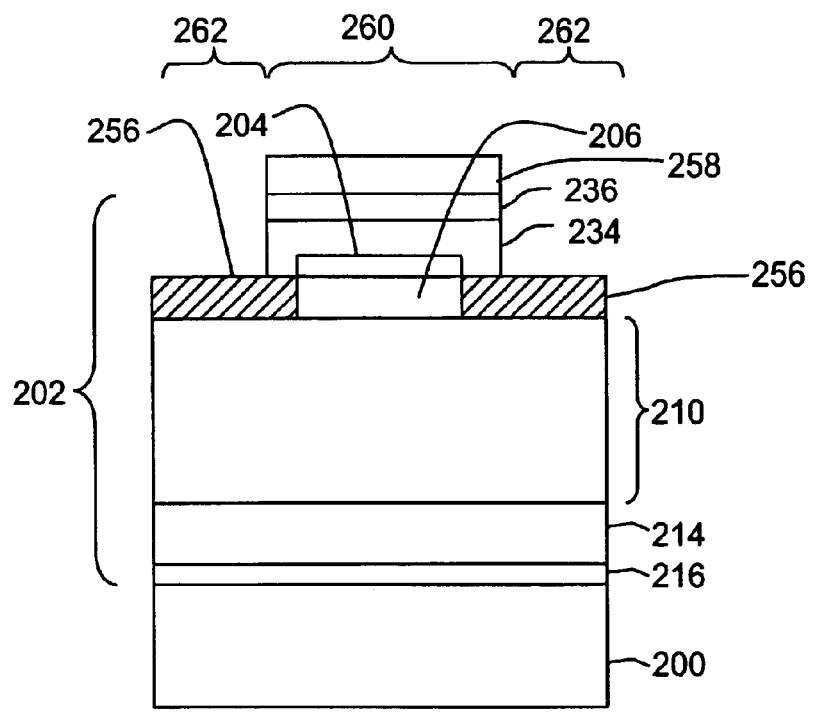
Figure 2J:
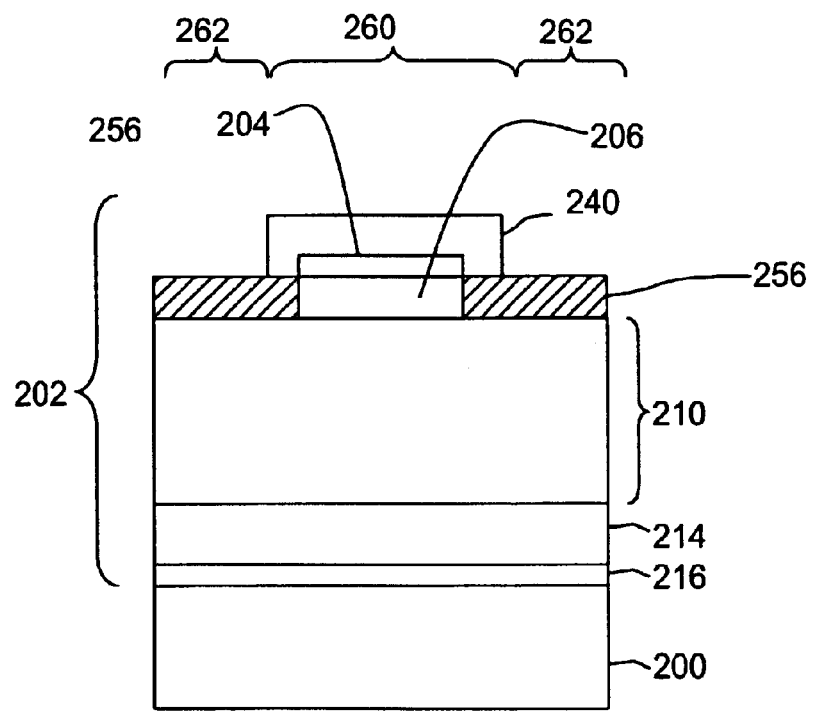
Figure 2K:
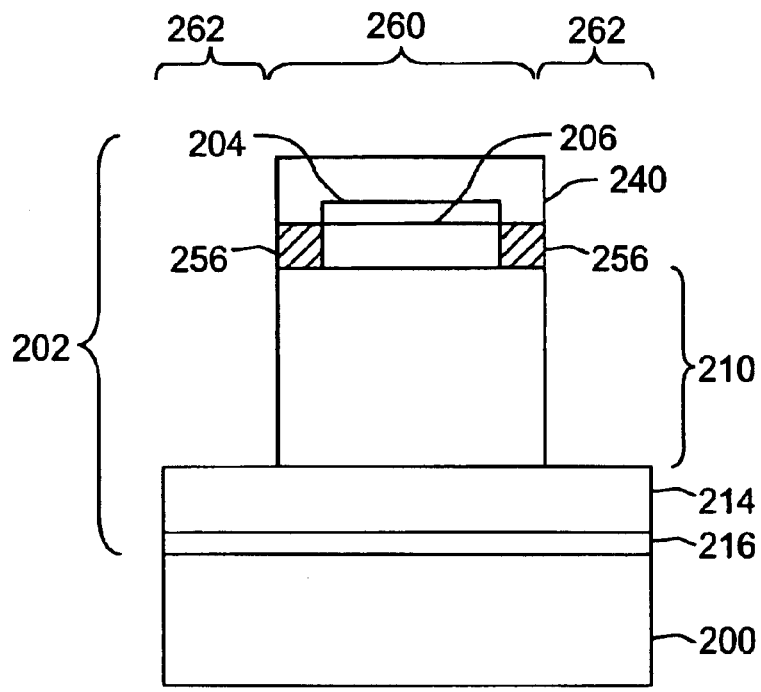
Figure 2L:
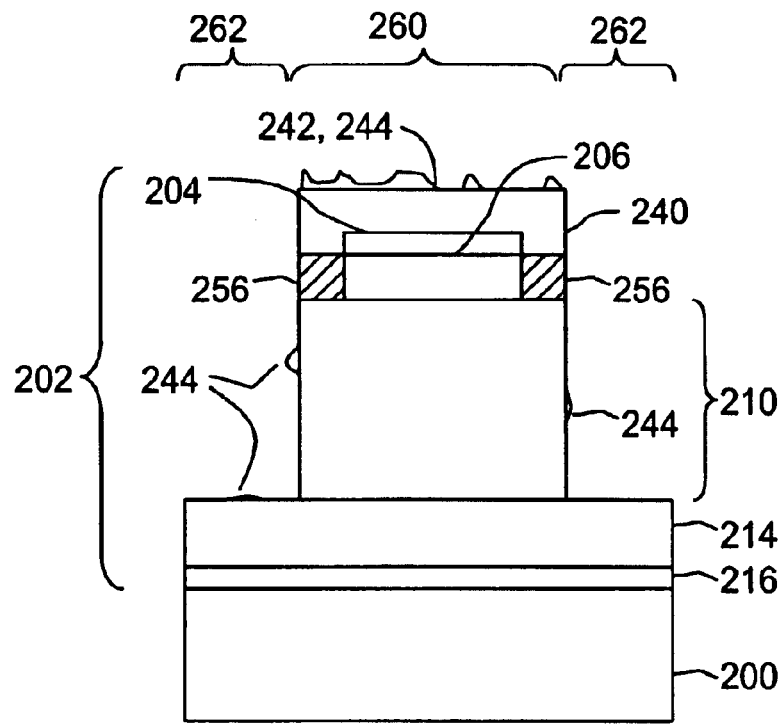
Figure 2M:
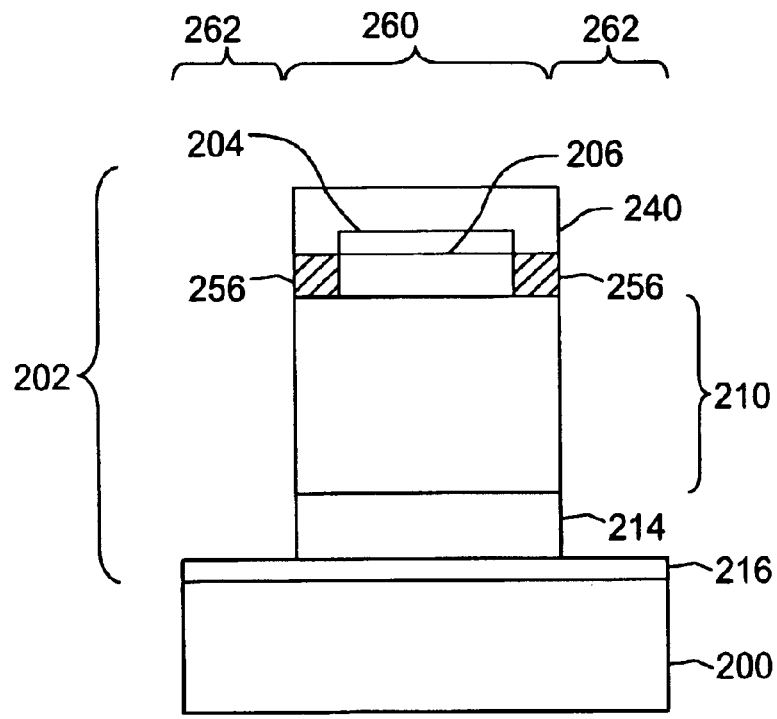
Figure 2N:
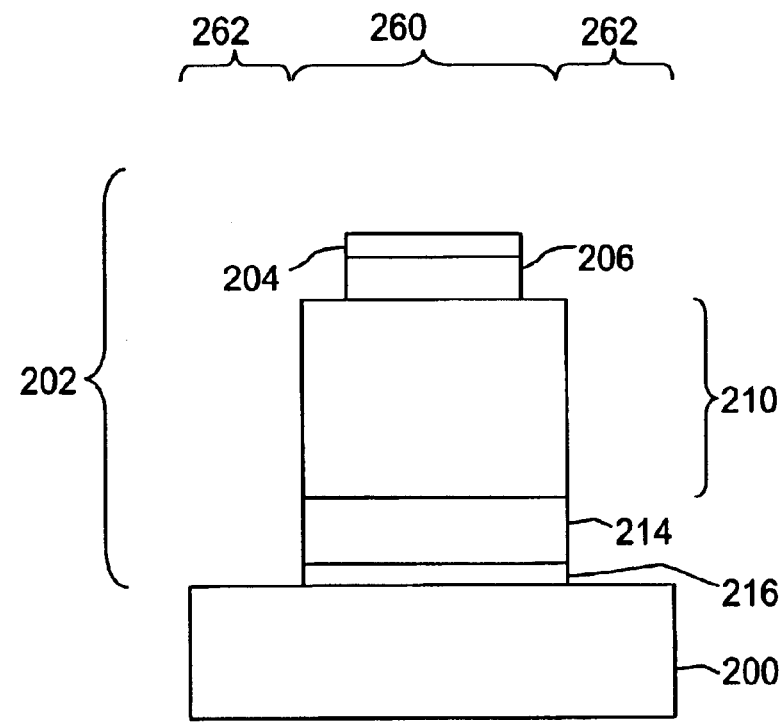

FIGS. 2A–2N depict a sequence of schematic, cross-sectional views of a substrate comprising a MRAM device being formed therein using the sequence 100. To best understand the invention, the reader should simultaneously refer to FIGS. 1A, 1B, and 2A–2N. The cross-sectional views in FIGS. 2A–2N relate to individual process steps that are used to form the device. Sub-processes and lithographic routines (i.e., exposure and development of photoresist, and the like) are not shown in FIGS. 1A, 1B and FIGS. 2A–2N. The images in FIGS. 2A–2N are not depicted to scale and are simplified for illustrative purposes.

The sequence 100 begins, at step 102, by forming a MRAM film stack 202 on a wafer 200 (FIG. 2A). In one embodiment, the stack 202 comprises a top electrode layer 204, a free magnetic layer 206, a tunnel layer 208, a multi-layer magnetic stack 210, a bottom electrode layer 214, and a barrier layer 216. In one exemplary embodiment, the magnetic stack 210 is a multi-layer stack that comprises layers of CoFe, Ru, CoFe, PtMn, NiFe, NiFeCr having a thickness of about 8, 20, 200, 10, and 30 Angstroms, respectively. Alternatively, in the magnetic stack 210, a PtMn may be replaced by an IrMn layer. The tunnel layer 208 is formed, for example, from alumina ($Al_2O_3$) or the like dielectric material to a thickness of about 10 Angstroms. The tunnel layer 208 is sandwiched between the free magnetic layer 206 and the magnetic stack 210 to form a magnetic tunnel junction of the MRAM device. The layer 206 is formed, e.g., from materials comprising the nickel and cobalt iron alloys such as CoFe, NiFe, and the like. The layer 206 may consist of one or more sub-layers or a combination of such alloys and generally formed to a total thickness of about 20–200 Angstroms. In one example, the top electrode 204 and the bottom electrode layer 214 are formed from conductors such as tantalum (Ta), tantalum nitride (TaN), and the like to a thickness of about 200–600 Angstroms. It should be understood, however, that the film stack 202 and the magnetic stack 210 may comprise layers that are formed from other materials or layers having a different thickness.

The layers that comprise the stack 202 may be deposited using a vacuum deposition technique such as an atomic layer deposition (ALD), a physical vapor deposition (PVD), a chemical vapor deposition (CVD), evaporation, and the like. Fabrication of the MRAM devices may be performed using the respective processing modules of CENTURA®, ENDURA®, and other semiconductor wafer processing systems available from Applied Materials, Inc. of Santa Clara, Calif. and others.

At step 104, a sacrificial layer 218, a bottom anti-reflective coating (BARC) layer 220, and a photoresist layer 222 are sequentially formed atop the film stack 202 (FIG. 2B). The layers 218, 220, and 222 may be formed using conventional deposition (layers 218, 220) and lithographic (layer 222) routines. In one example, the sacrificial layer 218 is formed from silicon dioxide to a thickness of about 500 Angstroms. The BARC layer 220 is positioned between the photoresist layer 222 and the sacrificial layer 218 and controls the reflection of light from the layer 218 during the exposure of the photoresist. As a feature size is reduced, inaccuracies in a pattern transfer process can arise from optical limitations inherent to the lithographic process such as the light reflection. The BARC layer 220 may be composed, for example, from inorganic materials such as silicon nitride, silicon carbide, and the like, or organic materials such as polyamides and polysulfones. Together, the layers 220 and 222 have a thickness of about 6000 Angstroms. In some applications, the BARC layer may not be necessary. As such, the BARC layer is considered optional.

At step 106, the photoresist layer 222 is processed using a conventional lithographic patterning routine. During the routine, the photoresist is exposed through a patterned mask, developed, and the undeveloped portion of the photoresist is removed. The remaining developed photoresist is generally a carbon-based polymer that forms a soft mask 252 on top of the stack 202 in the region 224 of the film stack 202 that is protected during an etch process (FIG. 2C).

At step 108, the BARC layer 220, the sacrificial layer 218, and the top electrode 204 are plasma etched using either a chlorine-based chemistry (e.g., comprising chlorine ($Cl_2$), hydrogen chloride (HCl), and the like) or fluorine-based chemistry (e.g., comprising carbon tetrafluoride ($CF_4$), trifluoromethane ($CHF_3$), and the like) and an inert gas such as argon (Ar). Step 108 uses the soft mask 252 as an etch mask to form a top electrode 204 and a first hard mask 230 in the region 224 and removes the layers 220, 218, and 204 in the unprotected regions 226. In one embodiment, step 108 uses the free magnetic layer 206 as an etch stop layer. Alternatively, the process time during step 108 can be terminated upon a certain optical emission occurring (e.g., at wavelength of about 3630 Angstroms), upon a particular duration occurring, or upon some other indicator determining that the top electrode layer 204 has been removed in the regions 226. During step 108, some amount of the etched metal (e.g., tantalum) from the layer 204 combines with components (e.g., chlorine ($Cl_2$) or fluorine(F)) of the etchant, partially etched polymeric material of the soft mask 252, and by-products of the etching process to form a metal-containing residue 228. The residue 228 may form a conductive veil on the side walls of the BARC layer 220 and the sacrificial layer 218 and may also rest elsewhere on the wafer 200 (FIG. 2D).

Step 108 can be performed in a Decoupled Plasma Source (DPS) II module of the Centura® system. The DPS II module uses a 2 MHz inductive plasma source to generate and sustain a high density plasma. A wafer is biased by a 13.56 MHz bias source. The decoupled nature of the plasma source allows independent control of ion energy and ion density. The DPS II module provides a wide process window over changes in source and bias power, etch gas chemistry and pressure, and wafer temperature and uses an endpoint system to determine an end of the etch process. The DPS II module is disclosed in detail with respect to FIG. 3 below.

In one embodiment, during etching of the layers 220, 218, and 204 in the DPS II module, step 108 supplies 40 to 80 sccm of $CF_4$, 10 to 30 sccm of $CHF_3$, and 40 to 80 sccm of Ar, applies power to an inductively coupled antenna of 200 to 3000 Watts, applies a cathode electrode bias power of 0 to 300 Watts, and maintains a wafer temperature at 0 to 500 degrees Celsius and a pressure in the reaction chamber at 5 to 40 mTorr. Such flow rates define a flow ratio of $CF_4$ to $CHF_3$ in the range of about 3:1. One specific process recipe provides 60 sccm of $CF_4$, 20 sccm of $CHF_3$, and 60 sccm of Ar, applies 1000 Watts to the antenna and 50 Watts to the cathode electrode, and maintains a wafer temperature at 80 degrees Celsius and a pressure in the reaction chamber at 10 mTorr.

At step 110, the conductive residue (veil) 228 is removed using a process that is performed in a wet cleaning module and comprises applying the ammonium hydroxide ($NH_4OH$)/hydrogen peroxide ($H_2O_2$) solvent (e.g., $NH_4OH$/$H_2O_2$/$H_2O$) followed by a rinse in distilled water (FIG. 2E). An illustrative single wafer cleaning module is described in detail with respect to FIG. 4 below. In one embodiment, the solvent comprises, by weight, about (0.1–10) parts of ammonium hydroxide ($NH_4OH$), (0.1–10) parts of hydrogen peroxide ($H_2O_2$), and (1–100) parts of deionized water ($H_2O$). The $NH_4OH/H_2O_2/H_2O$ solvent under the trade name of SC1 is available from Rhodia, Inc., Freeport, Tex. and other suppliers. After the wet dip in the SC1 solvent, the substrate 200 is rinsed in distilled water to remove any remaining traces of the solvent. Step 132 applies the solvent at a temperature of about 45 to 65 degrees Celsius for a duration of about 30 to 120 seconds. One specific solvent recipe comprises 1 part of $NH_4OH$, 1 part $H_2O_2$, and 10 parts of DI water.

At step 112, an oxidation process is performed. The oxidation process is a plasma process that uses an oxygen ($O_2$) based chemistry and the first hard mask 230 as an oxidation mask. In one embodiment, the oxidation process uses oxygen that is supplied into a reaction chamber in a gaseous form. In an alternative embodiment, at step 112, the oxygen is used in conjunction with nitrogen ($N_2$) that may be optionally mixed with one or more inert gases such as helium ($He_2$) and the like. In one embodiment, the oxidation process uses the tunnel layer 208 as a stop layer and the first hard mask 230 as an oxidation mask. In one exemplary embodiment, step 112 transforms the magnetic alloys that comprise the layer 206 in the unprotected regions 226 of the stack 202 and elsewhere on the wafer 200 into non-conductive oxides 256 (FIG. 2F). Step 112 does not transform the layer 206 into the oxides in the region 224 that is protected by the first hard mask 230. Simultaneously with oxidation of the free magnetic layer 206, step 112 removes, or strips, the soft mask 252 and the BARC layer 220.

The oxides that are formed during the oxidation process passivate the side walls of the top electrode 204 and the top magnetic layer 206 thus protecting them from being short-circuited by a conductive residue during the oxidation or any other consecutive process. Additionally, such oxides also passivate the entire areas (not shown) on the wafer 200 that surround an individual memory cell of a plurality of cells of MRAM and as such improve electrical isolation between the memory cells.

The oxidation process of step 112 may be accomplished in an etch reactor such as a DPS II reactor. In one embodiment, the etch and oxidation processes are performed sequentially in situ, i.e., in the same etch reactor. In such embodiment, the alternation of the etch and oxidation processes during processing of the consecutive wafers seasons the otherwise flaky conductive deposits that form on the ceramic ceiling and other inner surfaces of the reaction chamber during a preceding etch process. As conductivity of such deposits increases with a number of the etched wafers, the etch process repeatability decreases to a point that the etchant plasma may be terminated. The reaction chamber should be frequently wet cleaned to remove the deposits to stabilize the etch process and reduce particle contamination of the wafer unless the etch and oxidation processes alternate as described. The seasoning transforms the deposits into compounds that are non-conductive, non-flaky, and adhere to the inner surfaces of the reaction chamber. As such, the seasoned deposits generate much fewer particles and the reaction chamber may be cleaned less frequently. Additionally, when the etch and oxidation processes are performed in situ, a number and duration of movements that the wafer 200 undergoes in a semiconductor wafer processing system decreases. Therefore, the embodiment comprising the etch and oxidation processes that alternate in the same reactor facilitates improvements in a mean number of wafers between the wet cleaning routines (MWBC) during fabrication of the MRAM device.

Step 112 may be performed, for example, in a DPS II module. In one embodiment, step 112 supplies 10 to 50 sccm of $O_2$ and 10 to 100 sccm of $N_2$, applies power to the antenna of 200 to 3000 Watts, applies bias power of 0 to 300 Watts, and maintains a wafer temperature at 15 to 80 degrees Celsius and a pressure in the reaction chamber at 5 to 40 mTorr. In this embodiment, a duration of the oxidation and stripping process is between 30 and 120 seconds. One specific process recipe provides 100 sccm of $O_2$ and 10 sccm of $N_2$, applies 1000 Watts to the antenna and 10 Watts to the cathode electrode, and maintains a wafer temperature at 40 degrees Celsius and a pressure in the reaction chamber at 32 mTorr for 60 seconds.

Alternatively, during step 112, the oxidation process may be accomplished, for example, in the Advanced Strip and Passivation (ASP) module of the Centura® system. The ASP module is a microwave downstream oxygen plasma reactor in which the plasma is confined to a plasma tube and only reactive neutrals are allowed to enter a process chamber. Such a plasma confinement scheme precludes plasma-related damage of the substrate or circuits formed on the substrate. In the ASP module, a wafer backside is heated radiantly by quartz halogen lamps and the wafer temperature can be maintained at 20 to 400 degrees Celsius. A duration of a stripping process is generally between 30 and 120 seconds.

In one embodiment when the oxidation process is performed in the ASP module, step 112 supplies 1000 to 7500 sccm of $O_2$ and 0 to 500 sccm of $N_2$, applies a microwave power of 1000 to 2500 Watts, and maintains a wafer temperature at 100 to 250 degrees Celsius and a pressure in the reaction chamber at 1 to 10 Torr. One specific process recipe provides 3500 sccm of $O_2$ and 500 sccm of $N_2$, applies 1400 Watts of the microwave power, and maintains a wafer temperature at 200 degrees Celsius and a pressure in the reaction chamber at 2 Torr.

At step 114, similar to step 104, a sacrificial layer 234 (e.g., $SiO_2$), a BARC layer 236, and a photoresist layer 238 are sequentially formed as conformal layers upon the patterned top electrode 204 (e.g., Ta, TaN, and the like) as depicted in FIG. 2G. During a deposition of the sacrificial layer 234, any remaining material from the first hard mask 230 (i.e., remaining after step 112) becomes incorporated in the sacrificial layer 234 as shown in FIG. 2G.

Alternatively, at step 116, prior to deposition of the sacrificial layer 234, the first hard mask 230 may be removed using a buffered oxide etch (BOE) process followed by a rinse in distilled water. In one exemplary embodiment, the BOE wet dip process is performed in the wet cleaning module and comprises a dip of the wafer 200 in a solution of hydrogen fluoride (HF) and ammonium fluoride $NH_4F$. After the wet dip in the solution, the wafer 200 is rinsed in distilled water to remove any remaining traces of the BOE etchant. In one embodiment, step 116 applies a solution of hydrogen fluoride in ammonium fluoride comprising 1 to 49% of HF by volume, at a temperature of 10 to 30 degrees Celsius, for a duration of about 10 to 120 seconds. One specific process recipe provides a ratio by volume of ammonium fluoride to hydrogen fluoride of about 6:1 at a temperature of 15 degrees Celsius, for a duration of 10 seconds.

At step 118, similar to step 106, the photoresist layer 238 is processed using a conventional lithographic patterning routine, i.e., photoresist is exposed through a patterned mask, developed, and the undeveloped photoresist is removed. (FIG. 2H). The developed photoresist forms a soft mask 258 in the region 260 that should be protected during the consecutive etch processes. It should be noted that the region 260 and the soft mask 258 are patterned wider then the respective region 224 and the soft mask 252 were patterned during step 106. Accordingly, a region 262 that is not protected by the soft mask 252 is narrower than the region 226.

At step 120, the BARC layer 236 and the sacrificial layer 234 are plasma etched using either a chlorine-based or fluorine-based chemistry as described with respect to step 108. During step 120, the layers 236 and 234 are removed in the unprotected region 262 (FIG. 2I). In one embodiment, step 120 may use as an etch stop layer either the tunnel layer 208 as shown in FIG. 2I or, alternatively, the top layer (e.g., CoFe, NiFe, and the like) of the magnetic stack 210. However, the tunnel layer 208 is so thin (e.g., about 10 Angstroms) that, during step 120, it may be partially or totally removed (not shown) in the region 262.

At step 122, the photoresist layer 238 and the BARC layer 236 are removed, or stripped, and the underlying portion of the sacrificial layer 234 forms a second hard mask 240 (FIG. 2J). Step 122 may be reduced to practice, e.g., in either the DPS II or ASP modules using an oxygen based chemistry as described above in reference to step 112.

At step 124, the magnetic film stack 210 is etched using a boron chloride ($BCl_3$) chemistry (e.g., $Ar/BCl_3$ and the like) as an etchant. In one example, the stack 210 comprises, from top to bottom, the layers of CoFe, Ru, CoFe, PtMn or IrMn, NiFe, and NiFeCr that are sandwiched between the tunnel layer 208 and the bottom electrode layer 214. In one embodiment, step 124 etches the magnetic film stack 210 using the second hard mask 240 (e.g., $SiO_2$) as an etch mask and the bottom electrode 214 as an etch stop layer (FIG. 2K).

When performed in the DPS II module, step 124 supplies 5 to 20 sccm of $BCl_3$ and 20 to 80 sccm of Ar, applies the antenna power of 200 to 3000 Watts and the bias power of 0 to 300 Watts, and maintains a wafer temperature at 15 to 80 degrees Celsius and a pressure in the reaction chamber of 5 to 20 mTorr. One specific process recipe provides 20 sccm of $BCl_3$ and 80 sccm of Ar, applies 700 Watts to the antenna and 150 Watts to the cathode electrode, and maintains a wafer temperature at 80 degrees Celsius and a pressure in the reaction chamber at 5 mTorr.

During step 124, the by-products of the etching process that have a low volatility may produce a metal-containing residue 242 on the side walls of the film stack 202 and on the side walls and top of the second hard mask 240. The $Ar/BCl_3$ plasma chemistry in-situ removes the residue (veil) 242 from the side walls, however, the conductive veil may remain on a top of the second hard mask 240. Nevertheless, presence of the residue 242 is not detrimental to performing the next step (step 126) of the sequence 100.

At step 126, the bottom electrode layer 214 is plasma etched using a $Cl_2$ based etchant such as $Cl_2/Ar$ and the like. In one embodiment, using the DPS II module, step 126 etches the bottom electrode layer 214 using the second hard mask 240 (e.g., $SiO_2$) as an etch mask and the barrier layer 216 (e.g., $SiO_2$, silicon nitride ($Si_3N_4$), and the like) as an etch stop layer (FIG. 2L). The etch process may be performed in the DPS II module by supplying 10 to 100 sccm of $Cl_2$ and 10 to 100 sccm of Ar, applying the antenna power of 200 to 3000 Watts and the bias power of 0 to 300 Watts, and maintaining a wafer temperature at 15 to 80 degrees Celsius and a pressure in the reaction chamber at 5 to 40 mTorr. One specific process recipe provides 45 sccm of $Cl_2$ and 45 sccm of Ar, applies 700 Watts to the antenna and 75 Watts to the cathode electrode, and maintains a wafer temperature at 80 degrees Celsius and a pressure in the reaction chamber at 10 mTorr.

Step 126 may leave a post-etch metal-containing conductive residue 244 (e.g., containing tantalum). The remaining residue 242 and the residue 244 may combine together on the side walls of the film stack 202 and on the side walls and top of the second hard mask 240 thus forming a conductive veil on top of the of the second hard mask 240 and elsewhere on the substrate 200. These residues and the conductive veil should be removed prior to completion of the process 100. Steps 126 and 124 may be performed in-situ, i.e., in the same etch reactor, e.g., in the DPS II module, or each step may be performed in a dedicated reactor.

Alternatively, at step 128, the magnetic film stack 210 and the bottom electrode layer 214 may be simultaneously plasma etched using as an etchant a chlorine based chemistry (e.g., $Cl_2/Ar$ and the like). Step 128 consecutively etches through the layers of the magnetic film stack 210 and the bottom electrode layer 214. In one embodiment, step 128, similar to step 126, uses the second hard mask 240 (e.g., $SiO_2$) as an etch mask and the barrier layer 216 (e.g., $SiO_2$) as an etch stop layer. Step 126 may be performed, for example, in the DPS II module using the process recipe as described in reference to step 124. Step 128, similar to step 126, also leaves a post-etch metal-containing conductive residue (e.g., comprising tantalum) that should be removed prior to completion of the process 100.

At step 130, the metal-containing residues that after step 124 and step 126 or after step 128 rest on the film stack 202 or elsewhere on the substrate 200 are removed using a process that comprises a wet dip in the $NH_4OH/H_2O_2/H_2O$ solvent followed by a rinse in distilled water (FIG. 2M). In one embodiment, step 130 uses the wet cleaning module and the process recipe described in reference to step 110.

Alternatively, at optional step 132, the second hard mask 240, the metal-containing residues, the oxidized magnetic layer 256, and the exposed portion of the barrier layer 216 are removed using a buffered oxide etch (BOE) process followed by a rinse in distilled water (FIG. 2N). In one example, step 132 uses the wet cleaning module and the process recipe as described above in reference to step 116. Step 132 is used when a selected process of integration of a MRAM device within a MRAM memory cell does not benefit from a use of the layers 240 and 216.

Although the foregoing technique is disclosed in the context of fabricating an MRAM device, the method steps may be used individually or in a various combinations to form other structures. For example, a film stack comprising a layer of magnetic material may be patterned by independently using steps 104 through 112 of FIG. 1A to isolate regions of magnetic material using a hard mask and oxidation. Those skilled in the art will recognize that other combinations of the disclosed steps may be used to form various patterns, features and structures.

Figure 3:
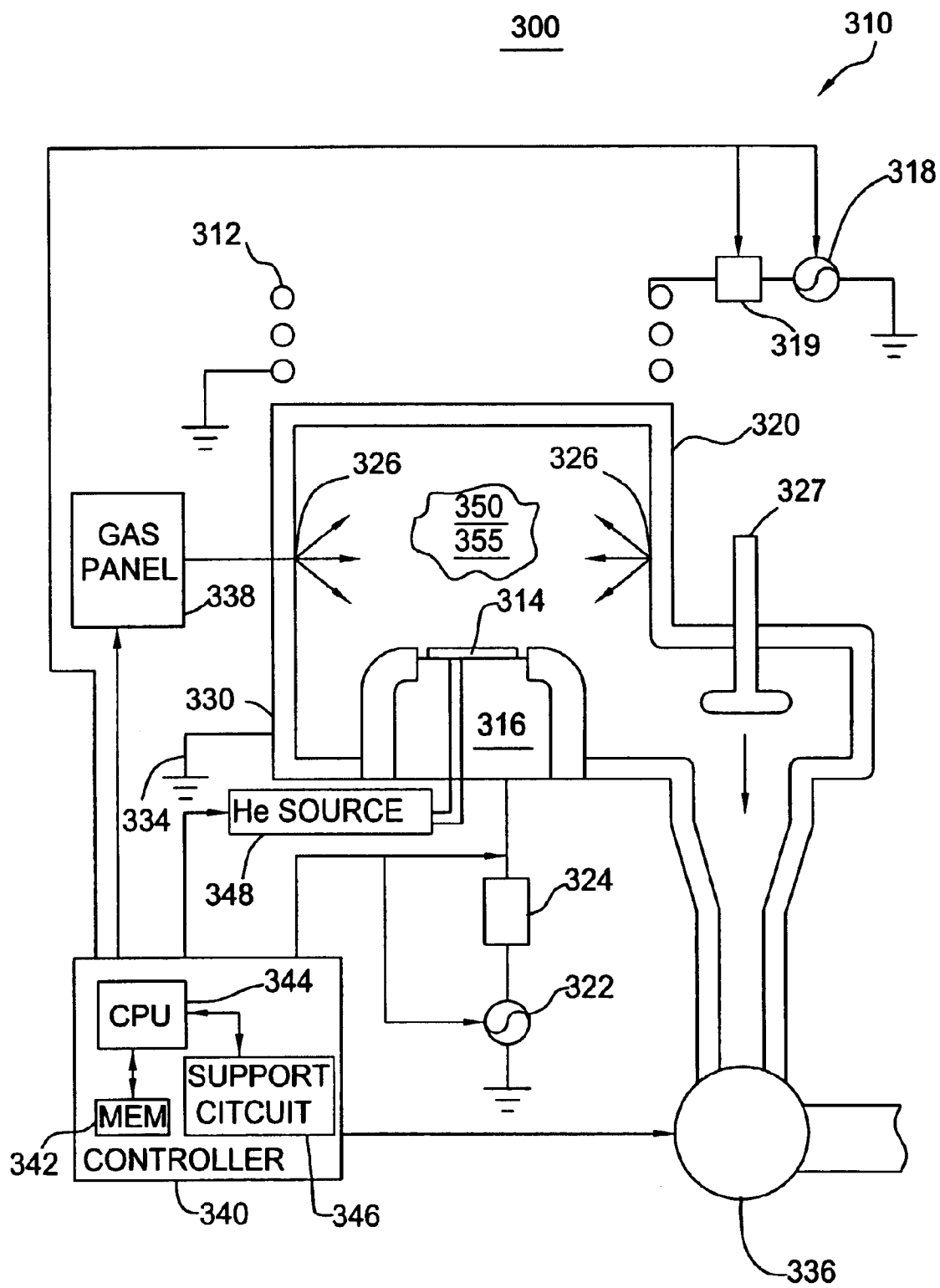
FIG. 3 depicts a schematic, cross sectional view of an etch and oxidation reactor.

One illustrative embodiment of an etch module (reactor) that can be used to perform the etching step(s) of the present invention is depicted in FIG. 3.

FIG. 3 depicts a schematic diagram of the DPS II etch reactor 300 that may be uses to practice the inventive method. The process chamber 310 comprises at least one inductive coil antenna segment 312, positioned exterior to a dielectric ceiling 320. Other modifications may have other types of ceilings, e.g., a dome-shaped ceiling. The antenna segment 312 is coupled to a radio-frequency (RF) source 318 that is generally capable of producing an RF signal having a tunable frequency of about 50 kHz and 13.56 MHz. The RF source 318 is coupled to the antenna 312 through a matching network 319. Process chamber 310 also includes a wafer support pedestal (cathode) 316 that is coupled to a source 322 that is generally capable of producing an RF signal having a frequency of approximately 13.56 MHz. The source 322 is coupled to the cathode 316 through a matching network 324. Optionally, the source 322 may be a DC or pulsed DC source. The chamber 310 also contains a conductive chamber wall 330 that is connected to an electrical ground 334. A controller 340 comprising a central processing unit (CPU) 344, a memory 342, and support circuits 346 for the CPU 344 is coupled to the various components of the DPS etch process chamber 310 to facilitate control of the etch process.

In operation, the semiconductor wafer 314 is placed on the wafer support pedestal 316 and gaseous components are supplied from a gas panel 338 to the process chamber 310 through entry ports 326 to form a gaseous mixture 350. The gaseous mixture 350 is ignited into a plasma 355 in the process chamber 310 by applying RF power from the RF sources 318 and 322 respectively to the antenna 312 and the cathode 316. The pressure within the interior of the etch chamber 310 is controlled using a throttle valve 327 situated between the chamber 310 and a vacuum pump 336. The temperature at the surface of the chamber walls 330 is controlled using liquid-containing conduits (not shown) that are located in the walls 330 of the chamber 310.

The temperature of the wafer 314 is controlled by stabilizing the temperature of the support pedestal 316 and flowing helium gas from source 348 to channels formed by the back of the wafer 314 and grooves (not shown) on the pedestal surface. The helium gas is used to facilitate heat transfer between the pedestal 316 and the wafer 314. During the processing, the wafer 314 is heated by a resistive heater within the pedestal to a steady state temperature and the helium facilitates uniform heating of the wafer 314. Using thermal control of both the ceiling 320 and the pedestal 316, the wafer 314 is maintained at a temperature of between 0 and 500 degrees Celsius. The RF power applied to the inductive coil antenna 312 has a frequency between 50 kHz and 13.56 MHz and has a power of 200 to 3000 Watts. The bias power of between 0 and 300 Watts is applied to the pedestal 316 may be in a form of a DC, pulsed DC, or RF power.

To facilitate control of the chamber as described above, the CPU 344 may be one of any form of general purpose computer processor that can be used in an industrial setting for controlling various chambers and sub-processors. The memory 342 is coupled to the CPU 344. The memory 342, or computer-readable medium, may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as software routine. The software routine may also be stored and/or executed by a second CPU (not shown) that is remotely located from the hardware being controlled by the CPU 344.

Figure 4:
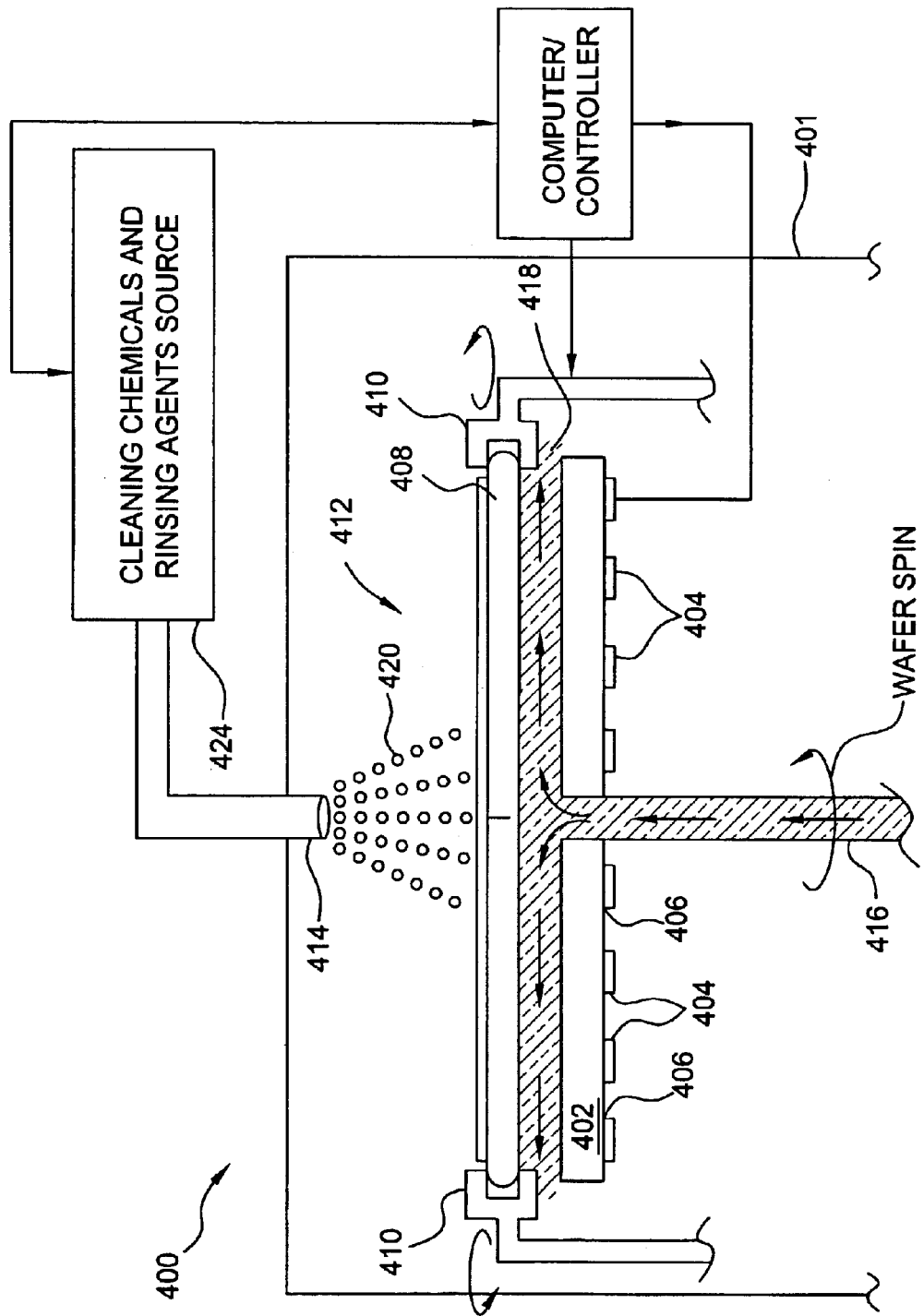
FIG. 4 depicts a schematic, cross sectional view of a wet cleaning module.

One illustrative embodiment of an apparatus that can be used for cleaning and rinsing a substrate in accordance with the present invention is a single substrate wet cleaning module. FIG. 4 depicts a simplified cross-sectional view of an illustrative embodiment of a single substrate wet cleaning module 400. The module 400 is described in detail in U.S. patent application Ser. No. 09/945,454, filed Aug. 31, 2001, which is herein incorporated by reference.

The module 400 applies cleaning chemicals and/or rinsing agents to the top and bottom of a substrate. To enhance the cleaning process, the module 400 uses acoustic or sonic waves to agitate the cleaning chemicals and/or rinsing agents.

The module 400 comprises a chamber 401, a nozzle 414, and a substrate support 412. The substrate support is mounted within the chamber 401 and comprises edge claps 410, plate 402 and a plurality of acoustic or sonic transducers 404. The plate 402 has a shape that is substantially the same as a substrate and supports the plurality of acoustic or sonic transducers 404. The plate 402 is, for example, made of aluminum, but can be formed of other materials such as, but not limited to, stainless steel and sapphire. The plate 402 is coated with a corrosion resistant fluoropolymer such as HALAR or PFA. The transducers 404 are attached to the bottom of the plate 402 using an adhesive, for example, an epoxy 406. In one embodiment of the cleaning module 400, the transducers 404 are arranged in an array that covers substantially the entire bottom surface of plate 402, e.g., approximately 80% of plate 402. The transducers generate sonic waves in the frequency range between 400 kHz and 8 MHz. In one embodiment of the module 400, the transducers are piezoelectric devices.

The plurality of edge clamps 410 retain the substrate 408 face up above the plate 402 to form a gap 418 between the backside of the wafer and the top surface of the plate 402. The gap 418 is approximately 3 mm. Cleaning chemicals and/or rinsing agents are provides to the gap via channel 416. The clamps are rotated to cause the substrate 408 to rotate about its central axis at a rate between 0 and 6000 rpm. In this embodiment of the module 400, the substrate 408 and clamps 410 rotate, while the plate 402 is stationary.

The nozzle 414 sprays cleaning chemicals and/or rinsing agents upon the top of the substrate 408 (i.e., the surface of the substrate comprising features, transistors, or other circuitry). As the nozzle 414 sprays the top of the substrate 408, the same or different cleaning chemicals and/or rinsing agents are supplied to the gap 418 via channel 416 as the substrate is rotated such that the cleaning chemicals and/or rinsing agents flow across the top and bottom surfaces of the substrate.

The nozzle 414 and channel 416 are coupled to a source 424 of cleaning chemicals and/or rinsing agents. The source 424 may be the same for the nozzle 414 and channel 416, or a separate source may be couple to each of the nozzle 414 and channel 416. In the present embodiment of the invention, the module 400 is used to clean the substrate 408 using hydrogen fluoride, ammonium fluoride, hydrogen peroxide, ammonium hydroxide and deionized water. The module 400 is further used to rinse the substrate in deionized water.

A computer controller 426 is generally used to control the operation of the module 400. Specifically, the computer controller 426 controls the rotation of the substrate support 412, the activation of the transducers 404, the supply of cleaning chemicals and/or rinsing agents, and so on.

Figure 5:
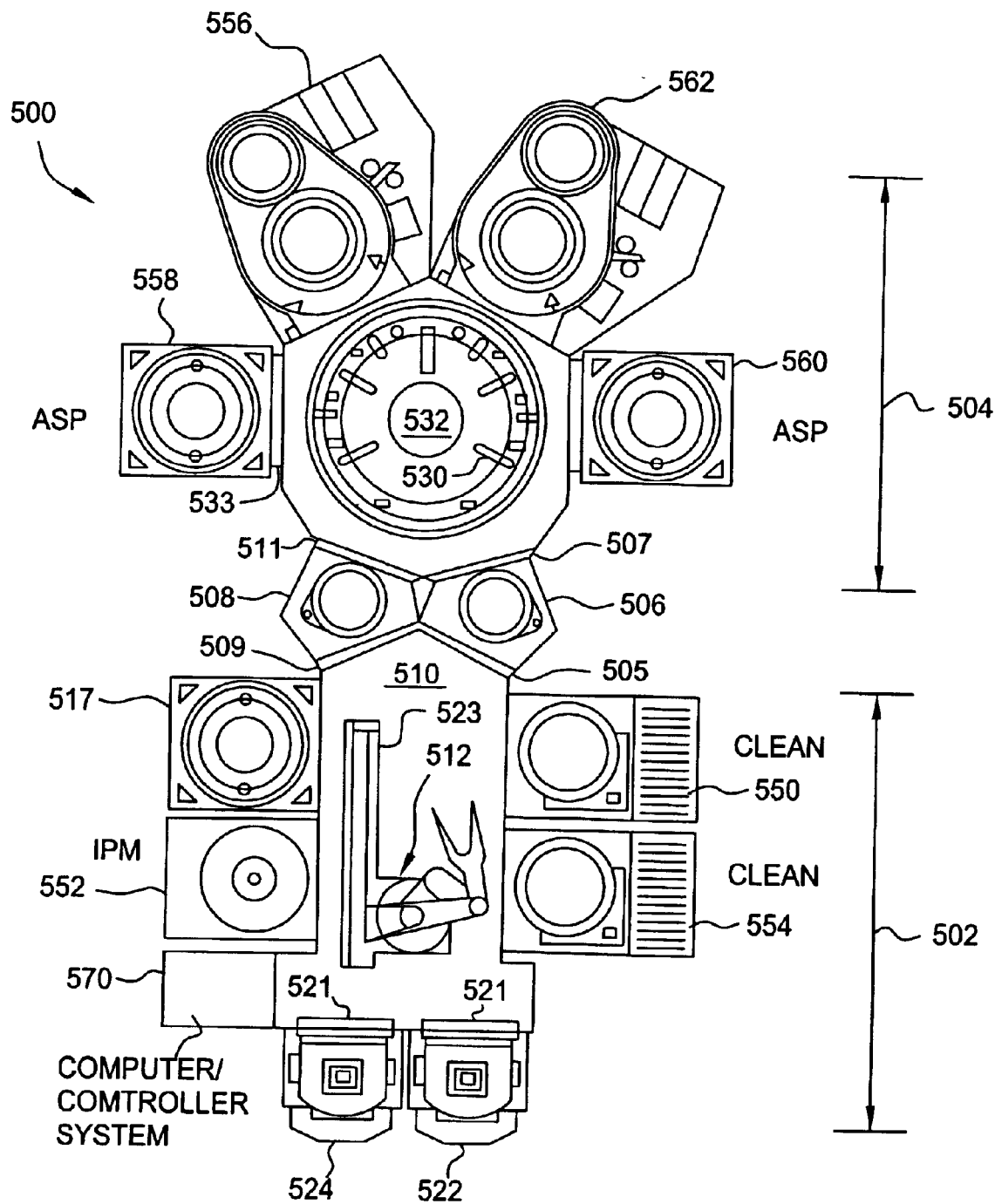
FIG. 5 depicts a schematic, plan view of an integrated platform used to perform the method of the present invention.

The method 100 of the present invention is illustratively performed on an integrated processing platform 500 shown in FIG. 5 that comprises apparatus for performing both atmospheric and sub-atmospheric processing. The platform 500 and the various modules and tools that can be used with such a platform are described in detail in U.S. patent application Ser. No. 09/945,454, filed Aug. 31, 2001, which is herein incorporated by reference.

Depending upon the process modules that are used in the platform 500, the platform 500 (also referred to as a process tool) can be used to perform etching, oxidation, substrate cleaning, photoresist stripping, substrate inspection and the like. The platform 500 comprises an atmospheric platform 502 and a sub-atmospheric platform 504. The sub-atmospheric platform 504 and the atmospheric platform 502 may be coupled together by a single substrate load lock 506 or, as shown in the depicted example, are coupled together by a pair of single load locks 506 and 508. In some applications, the sub-atmospheric and atmospheric platforms 504 and 502 are not coupled together and may be used separately. In one configuration, the stand-alone platform 502 may contain photoresist stripping modules and wet cleaning modules that perform post-etch processing.

The atmospheric platform 502 comprises a central atmospheric transfer chamber 510 containing a substrate handling device 512, such as a robot. Directly attached to the atmospheric transfer chamber 510 is a substrate wet cleaning module 550, an integrated particle monitor 552 and a critical dimension (CD) measuring tool 554, and a photoresist stripping chamber 517. A dry clean module (not shown) can also be attached to the atmospheric transfer chamber 510, if desired. Each module or tool is coupled to the transfer chamber 510 by a separately closable and sealable opening, such as a slit valve. The transfer chamber is maintained at substantially atmospheric pressure during operation. The substrate handling device 512 is able to transfer substrates from one module or tool to another module or tool that is attached to the atmospheric transfer chamber 510. In the embodiment shown, the substrate handling device 512 is a dual blade, single arm, single wrist robot. Other types of robots may be used to access the various modules and tools.

The atmospheric transfer chamber 510 is coupled to at least one substrate input/output module 520 that provides and receives substrates to and from the platform 500. In one embodiment of the platform 500, the module 520 comprises at least one front opening unified pod (FOUP). Two FOUPs 522 and 524 are depicted. The substrate handling device 512 accesses each FOUP through a sealable access door 521. The substrate handling device 512 moves linearly along a track 523 to facilitate access to all of the modules and tools.

The atmospheric transfer chamber 510 is coupled to the pair of load locks 506 and 508 through sealable doors 505 and 509 such that the substrate handling device 512 can access the load locks 506 and 508. The sub-atmospheric platform 504 comprises a central sub-atmospheric transfer chamber 530 and a plurality of process chambers 556, 558, 560, and 562. Sealable doors 507 and 511 respectively couple each load lock 506 and 508 to the sub-atmospheric transfer chamber 530. The sub-atmospheric transfer chamber 530 contains a substrate handing device 532, such as a robot (not shown), that accesses the load locks 506 and 508 as well as the process chambers 556, 558, 560 and 562. The process chambers 556, 558, 560 and 562 are each coupled to the sub-atmospheric transfer chamber 530 via separately closable and sealable openings, such as slit-valves. The process chambers 556, 558, 560 and 562 may comprise one or more etching chambers such as the DPS or DPS II chamber. Additionally, one or more photoresist stripping chambers such as the ASP chamber described above may be used as one or more of the process chambers 556, 558, 560 and 562. As also described above, the ASP chamber, if used, may be located either on the sub-atmospheric platform 504 or the atmospheric platform 502. FIG. 5 shows the sub-atmospheric platform 504 comprising two etch and oxidation chambers 558 and 560 and two photoresist stripping chambers 556 and 562. The sub-atmospheric platform 504 is, for example, a CENTURA platform available from Applied Materials, Inc. of Santa Clara, Calif.

The platform 500 also includes a system computer 570 that is coupled to and controls each module that is coupled to the atmospheric and sub-atmospheric platforms 502 and 504, controls the substrate handling devices 512 and 532, and controls the load locks 506 and 508. Generally, the system computer 570 controls all aspects of operation of the platform 500 either by direct control of the sub-systems, modules, tools and apparatus or by controlling the computers associated with those sub-systems, modules, tools and apparatus. The system computer 570 enables feedback from one module or tool to be used to control the flow of substrates through the platform 500 and/or control the processes or operation of the various modules and tools to optimize substrate throughput.

The MRAM device operates by applying a voltage across the electrodes 204 and 214 to set the direction of the magnetic moments in the free magnetic layer 206. The layer of PtMn is a "pinning" layer that sets (or pins) the direction of the magnetic moments of the magnetic film stack 210 (the "pinned" layer). Depending on whether the direction of moments in the free magnetic layer 206 is aligned with the direction of the pinned layer 210 or is opposed to the direction of the magnetic moments in the pinned layer 210, the electrical current through the MRAM device is either high or low. The establishment of the moment direction in the free magnetic layer 206 is used to store information in an MRAM cell. A plurality of the cells can be arranged to form a MRAM memory array.

Although the forgoing discussion referred to fabrication of the MRAM device, fabrication of the other structures and features used in the integrated circuits and devices can benefit from the invention. The invention can be practiced in other etch semiconductor processing systems where the processing parameters may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. A method of fabricating a magneto-resistive random access memory (MRAM) device from a film stack comprising a top electrode, a free magnetic layer, a tunnel layer, a magnetic film stack, and a bottom electrode that are formed on a semiconductor substrate, comprising:
   (a) depositing a layer of material that is used to form a first sacrificial hard mask on the top electrode;
   (b) forming a first sacrificial hard mask and etching the top electrode wherein said etching of the top electrode produces a first residue;
   (c) removing the first residue;
   (d) oxidizing the free magnetic layer outside a perimeter of the top electrode;
   (e) forming a second sacrificial hard mask on the top electrode;
   (f) etching the tunnel layer and the magnetic film stack;
   (g) etching the bottom electrode wherein said etching of the bottom electrode produces a second residue; and
   (h) removing the second residue.

2. The method of claim 1 wherein:
   the first and the second sacrificial hard masks comprise $SiO_2$;

the top electrode comprises at least one of Ta or TaN;

the free magnetic layer comprises at least one of NiFe or CoFe;

the tunnel layer comprises $Al_2O_3$;

the magnetic film stack comprises at least one of NiFe, Ru, CoFe, PtMn, NiFe, or NiFeCr; and the bottom electrode comprises at least one of Ta or TaN.

3. The method of claim 1 wherein step (b) and step (d) are performed in the same reactor.

4. The method of claim 3 wherein the reactor contains post-processing deposits after step (b) and step (d) oxidizes said deposits into non-conductive materials.

5. The method of claim 1 wherein step (b) further comprises:

(b1) forming the first sacrificial hard mask; and (b2) etching the top electrode.

6. The method of claim 1 wherein step (b2) uses a plasma comprising $CF_4$, $CHF_3$, and Ar.

7. The method of claim 5 wherein step (b2) comprises:

supplying about 40 to 80 sccm of $CF_4$, 10 to 30 sccm of $CHF_3$, and 40 to 80 sccm of Ar, maintaining in a reaction chamber a gas pressure at about 5 to 40 mTorr, applying a bias power to a cathode electrode of about 0 to 300 Watt, applying power to an inductively coupled antenna of about 200 to 3000 Watt, and maintaining the substrate at a temperature of about 100 to 500 degrees Celsius.

8. The method of claim 1 wherein step (c) further comprises:

applying a solvent comprising $NH_4OH$, $H_2O_2$, and $H_2O$ to the substrate until a residue that is present on the substrate after step (b) is removed; and rinsing the substrate in distilled water.

9. The method of claim 8 wherein the solvent comprises, by weight, about (0.1–10) parts of $NH_4OH$, (0.1–10) parts of $H_2O_2$, and (1–100) parts of $H_2O$, and is applied at a temperature of about 45 to 65 degrees Celsius for a duration of about 30 to 120 seconds.

10. The method of claim 8 wherein the solvent comprises, by weight, 1 part of $NH_4OH$, 10 part of $H_2O_2$, and 10 parts of $H_2O$, and is applied at a temperature of about 45 to 65 degrees Celsius for a duration of about 30 to 120 seconds.

11. The method of claim 8 wherein step (d) further comprises:

(d1) applying a plasma comprising oxygen to oxidize the free magnetic layer.

12. The method of claim 11 wherein the plasma during step (d1) comprises $N_2$.

13. The method of claim 11 wherein step (d1) further comprises:

supplying 10 to 100 sccm of $O_2$ and 0 to 100 sccm of $N_2$, maintaining in a reaction chamber a gas pressure at about 5 to 40 mTorr, applying a bias power to a cathode electrode of about 0 to 300 Watt, applying power to an inductively coupled antenna of about 200 to 3000 Watt, and maintaining the substrate at a temperature of about 15 to 80 degrees Celsius.

14. The method of claim 11 wherein step (d1) further comprises:

supplying about 1000 to 7500 sccm of $O_2$ and 0 to 500 sccm of $N_2$, maintaining in a reaction chamber a gas pressure at about 1 to 10 Torr, applying microwave power to excite downstream plasma of about 1000 to 2500 Watt, and maintaining the substrate at a temperature of about 100 and 250 degrees Celsius.

15. The method of claim 1 wherein the second sacrificial hard mask is wider than the first sacrificial hard mask.

16. The method of claim 1 wherein step (e) further comprises:

supplying about 40 to 80 sccm of $CF_4$, 10 to 30 sccm of $CHF_3$, and 40 to 80 sccm of Ar, maintaining in a reaction chamber a gas pressure at about 5 to 40 mTorr, applying a bias power to a cathode electrode of about 0 to 300 Watt, applying power to an inductively coupled antenna of about 200 to 3000 Watt, and maintaining the substrate at a temperature of about 100 to 500 degrees Celsius.

17. The method of claim 1 wherein step (f) further comprises:

etching the magnetic film stack in a plasma comprising $BCl_3$.

18. The method of claim 1 wherein step (g) is performed using the same etching chemistry as step (f).

19. The method of claim 1 wherein step (f) comprises:

supplying about 5 to 20 sccm of $BCl_3$ and 20 to 80 sccm of Ar, maintaining in a reaction chamber a gas pressure at about 5 to 20 mTorr, applying a bias power to a cathode electrode of about 0 to 300 Watt, applying power to an inductively coupled antenna of about 200 to 3000 Watt, and maintaining the substrate at a temperature of about 15 to 80 degrees Celsius.

20. The method of claim 1 wherein step (g) further comprises:

etching the bottom electrode in a plasma comprising $Cl_2$.

21. The method of claim 1 wherein step (g) comprises:

supplying about 10 to 100 sccm of $Cl_2$ and 10 to 100 sccm of Ar, maintaining in a reaction chamber a gas pressure at about 5 to 40 mTorr, applying a bias power to a cathode electrode of about 0 to 300 Watt, applying power to an inductively coupled antenna of about 200 to 3000 Watt, and maintaining the substrate at a temperature of about 15 to 80 degrees Celsius.

22. The method of claim 1 wherein step (h) further comprises:

applying a solvent comprising $NH_4OH$, $H_2O_2$, and $H_2O$ to the substrate and until a residue that is present on the substrate after step (g) is removed; and rinsing the substrate in a distilled water.

23. The method of claim 22 wherein the solvent comprises by weight about (0.1–10) parts of $NH_4OH$, (0.1–10) parts of $H_2O_2$, and (1–100) parts of $H_2O$, and is applied at a temperature of about 45 to 65 degrees Celsius for a duration of about 30 to 120 seconds.

24. The method of claim 22 wherein the solvent comprises, by weight, 1 part of $NH_4OH$, 10 part of $H_2O_2$, and 10 parts of $H_2O$, and is applied at a temperature of about 45 to 65 degrees Celsius for a duration of about 30 to 120 seconds.

* * * * *

UNITED STATES PATENT AND TRADEMARK OFFICE
CERTIFICATE OF CORRECTION

PATENT NO. : 6,759 263 B2 Page 1 of 1
DATED : July 6, 2004
INVENTOR(S) : Ying et al.

It is certified that error appears in the above-identified patent and that said Letters Patent is hereby corrected as shown below:

Column 9,
Line 66, after "2001" insert -- (attorney docket number 4936) --.

Column 10,
Line 64, after "2001" insert -- (attorney docket number 4936) --.

Column 13,
Line 18, delete "claim 1" and insert -- claim 5 --, therefor.
Line 45, delete "claim 8" and insert -- claim 1 --, therefor.

Signed and Sealed this

Twelfth Day of July, 2005

JON W. DUDAS
*Director of the United States Patent and Trademark Office*